United States Patent
Tsai et al.

(10) Patent No.: US 6,183,937 B1
(45) Date of Patent: Feb. 6, 2001

(54) POST PHOTODEVELOPMENT ISOTROPIC RADIATION TREATMENT METHOD FOR FORMING PATTERNED PHOTORESIST LAYER WITH ATTENUATED LINEWIDTH

(75) Inventors: Chia-Shiung Tsai; Hun-Jan Tao, both of Hsin-chu (TW)

(73) Assignee: Taiwan Semiconductor Manufacturing Company, Hsin-chu (TW)

( * ) Notice: Under 35 U.S.C. 154(b), the term of this patent shall be extended for 0 days.

(21) Appl. No.: 09/072,997

(22) Filed: May 6, 1998

(51) Int. Cl.$^7$ ........................................ G03F 7/00
(52) U.S. Cl. ...................... 430/313; 430/317; 430/330
(58) Field of Search ........................... 430/313, 328, 430/317, 323, 325, 290, 330

(56) References Cited

U.S. PATENT DOCUMENTS

| | | | |
|---|---|---|---|
| 4,625,120 | 11/1986 | Caprari | 250/492.1 |
| 4,749,436 | * 6/1988 | Minato et al. | 156/345 |
| 4,868,095 | * 9/1989 | Suzuki et al. | 430/326 |
| 4,876,177 | * 10/1989 | Akahoshi et al. | 430/313 |
| 5,096,802 | * 3/1992 | Hu | 430/328 |
| 5,300,403 | * 4/1994 | Angelopolus et al. | 430/325 |
| 5,385,804 | 1/1995 | Premlatha et al. | 430/195 |
| 5,635,333 | * 6/1997 | Petersen et al. | 430/311 |
| 5,641,715 | 6/1997 | Okamoto | 438/669 |
| 5,648,198 | * 7/1997 | Shibata | 430/296 |
| 5,650,262 | 7/1997 | Münzel et al. | 430/270.1 |
| 5,652,084 | * 7/1997 | Cleeves | 430/315 |
| 5,660,957 | * 8/1997 | Chou et al. | 430/5 |
| 5,837,428 | * 11/1998 | Huang et al. | 430/313 |

* cited by examiner

Primary Examiner—Kathleen Duda
(74) Attorney, Agent, or Firm—Goerge O. Saile; Stephen B. Ackerman; Alek P. Szecsy

(57) ABSTRACT

A method for forming a patterned photoresist layer. There is first provided a substrate employed within a microelectronics fabrication. There is then formed over the substrate a blanket photoresist layer. There is then photoexposed and developed the blanket photoresist layer to form a patterned photoresist layer having a first linewidth. There is then irradiated isotropically the patterned photoresist layer with an isotropic radiation source to decompose a conformal surface layer of the patterned photoresist layer while simultaneously forming a conformal surface layer decomposed patterned photoresist layer having a second linewidth narrower than first linewidth. The conformal surface layer decomposed patterned photoresist layer may then be employed as an etch mask layer when etching a blanket microelectronics layer formed interposed between the substrate and the conformal surface layer decomposed patterned photoresist layer. Through the method there may be formed a patterned microelectronics layer of narrow linewidth without employing an advanced photoexposure apparatus.

7 Claims, 3 Drawing Sheets

POST PHOTODEVELOPMENT ISOTROPIC RADIATION TREATMENT METHOD FOR FORMING PATTERNED PHOTORESIST LAYER WITH ATTENUATED LINEWIDTH

BACKGROUND OF THE INVENTION

1. Field of the Invention

The present invention relates generally to methods for forming patterned layers within microelectronics fabrications. More particularly, the present invention relates to methods for forming within microelectronics fabrications patterned layers of linewidth dimension narrower than the linewidth dimension of patterned photoresist layers employed in defining the patterned layers.

2. Description of the Related Art

Microelectronics fabrications are formed from microelectronics substrates over which are formed patterned microelectronics conductor layers which are separated by microelectronics dielectric layers.

As microelectronics fabrication technology has advanced, and microelectronics device and patterned microelectronics conductor layer density have increased, there has evolved a continuing and correlating trend towards decreasing linewidth dimensions of microelectronics devices and patterned microelectronics conductor layers through which are formed advanced microelectronics circuits within advanced microelectronics fabrications. The decreasing linewidth dimensions have typically traditionally been effected principally through decreasing the wavelength of photoexposure radiation employed in forming patterned photoresist layers which are employed in defining the linewidth dimensions of those microelectronics devices and patterned microelectronics conductor layers. Currently, photoexposure radiation is typically in the deep ultraviolet (DUV) (ie: 248 nanometer) wavelength region for forming microelectronics devices and patterned microelectronics layers of linewidth dimension typically as narrow as about 0.25 microns, while the most advanced photoexposure tooling typically employs a photoexposure radiation in the x-ray wavelength region for forming microelectronics devices and patterned microelectronics layers of linewidth dimensions in the deep submicron region as narrow as about 0.10 micron.

While the trend towards decreasing wavelength of photoexposure radiation as a means for providing microelectronics devices and patterned microelectronics layers of decreased linewidth dimensions within advanced microelectronics fabrications will most certainly continue, it nonetheless becomes important to provide methods and materials through which the evolution from the current generations of microelectronics fabrications having formed therein microelectronics devices and patterned microelectronics layers defined by photoexposure tooling employing a deep ultraviolet (NUV) (ie: 248 nanometer) photoexposure radiation wavelength to future generations of microelectronics fabrications having formed therein microelectronics devices and patterned microelectronics layers defined by advanced generations of photoexposure tooling employing an x-ray photoexposure radiation wavelength may be smoothly facilitated. In that regard, it is typically desirable to characterize to the extent possible, through relevant research and development activities, advanced microelectronics devices and patterned microelectronics layers of decreased linewidth dimensions at the earliest possible opportunity prior to committing production of microelectronics fabrications having formed therein those advanced microelectronics devices and patterned microelectronics layers of decreased linewidth dimensions to advanced photoexposure tooling. Among other advantages, such pre-production characterization allows for efficient use of advanced photoexposure tooling when initiating production of the advanced microelectronics fabrications within a manufacturing environment.

In particular, within advanced integrated circuit microelectronics fabrications having formed therein advanced field effect transistors (FETs) defined by gate electrodes of diminished linewidth dimensions, it is typically desirable to fully characterize those advanced field effect transistors (FETs) prior to production of those advanced field effect transistors (FETs) since the gate electrode linewidth within a field effect transistor (FET) defines the channel width within the field effect transistor (FET) which in part defines the operational characteristics of the field effect transistor (FET).

It is thus towards providing a method for forming within advanced microelectronics fabrications advanced microelectronics devices and patterned microelectronics layers having decreased linewidth dimensions without the need for employing advanced photoexposure apparatus in forming those advanced microelectronics devices and patterned microelectronics layers that the present invention is generally directed.

Various photolithographic methods, materials and apparatus have been disclosed in the art of microelectronics fabrication for forming patterned photoresist layers within microelectronics fabrications.

For example, Capari, in U.S. Pat. No. 4,625,120, discloses a deep ultraviolet (DUV) flood exposure apparatus for irradiating a deep ultraviolet (DUV) sensitive photoresist layer formed upon a microelectronics substrate such as a semiconductor substrate. The apparatus employs a xenon lamp positioned at the focal point of a spherical reflector which in turn is positioned at one end of a cylindrical baffle, where the sidewalls of the cylindrical baffle are fabricated such that the deep ultraviolet (DUV) sensitive photoresist layer formed upon the microelectronics substrate when positioned at the opposite end of the baffle is irradiated with a substantially collimated deep ultraviolet (DUV) radiation beam.

In addition, Premlatha et al., in U.S. Pat. No. 5,385,804, disclose a silicon containing negative photoresist material derived from a polysilsesquioxane polymer having incorporated therein aromatic azide side groups. The silicon containing negative photoresist material is developable within an aqueous alkaline developer, while simultaneously possessing enhanced oxygen plasma resistance and high sensitivity to deep ultraviolet, i-line and electron beam photoexposure radiation.

Further, Okamoto, in U.S. Pat. No. 5,641,715, discloses a photolithographic method employing either a chemical amplification positive electron beam photoresist material layer or a chemical amplification negative electron beam photoresist material layer for forming integrated circuit microelectronics structures within integrated circuit microelectronics fabrications. The photolithographic method employs a conductive polymer layer formed upon the chemical amplification positive electron beam photoresist material layer or the chemical amplification negative electron beam photoresist material layer, in order to prevent electrical charging of either of the chemical amplification photoresist material layers and to stabilize either of the chemical amplification photoresist material layers during an electron beam writing process.

Finally, Munzel et al., in U.S. Pat. No. 5,650,262, disclose a high resolution negative chemical amplification photoresist material developable with wide process latitude in an aqueous alkaline media. The high resolution negative chemical amplification photoresist material comprises: (1) a radiation sensitive acid generator; (2) a compound which reduces the solubility of the resist in aqueous alkaline media in the presence the acid; and (3) a polyhydroxy compound.

Desirable in the art of microelectronics fabrication are photolithographic methods through which there may be formed within advanced microelectronics fabrications microelectronics devices and patterned microelectronics layers having decreased linewidth dimensions without employing advanced photoexposure apparatus in forming those advanced microelectronics devices and patterned microelectronics layers. It is towards that goal that the present invention is directed.

SUMMARY OF THE INVENTION

A first object of the present invention is to provide a photolithographic method for forming within a microelectronics fabrication a patterned microelectronics layer.

A second object of the present invention is to provide a method in accord with the first object of the present invention, where the patterned microelectronics layer is formed of narrow linewidth dimension without employing an advanced photoexposure apparatus.

A third object of the present invention is to provide a method in accord with the first object of the present invention or the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a patterned photoresist layer. To practice the method of the present invention, there is first provided a substrate. There is then formed over the substrate a blanket photoresist layer. There is then photoexposed and developed the blanket photoresist layer to form a patterned photoresist layer having a first linewidth. There is then irradiated isotropically the patterned photoresist layer with an isotropic radiation source to decompose a conformal surface layer of the patterned photoresist layer while simultaneously forming a conformal surface layer decomposed patterned photoresist layer having a second linewidth narrower than first linewidth. The conformal surface layer decomposed patterned photoresist layer may then be employed as an etch mask layer for forming a patterned microelectronics layer from a blanket microelectronics layer formed interposed between the substrate and the conformal surface layer decomposed patterned photoresist layer.

The present invention provides a photolithographic method for forming within a microelectronics fabrication a patterned microelectronics layer, where the patterned microelectronics layer is formed with narrow linewidth dimension without employing an advanced photoexposure apparatus. The method of the present invention realizes this object by irradiating isotropically a patterned photoresist layer having a first linewidth to form a conformal surface layer decomposed patterned photoresist layer (i.e. a partially decomposed patterned photoresist layer) having a second linewidth narrower than the first linewidth, where the conformal surface layer decomposed patterned photoresist layer is subsequently employed as an etch mask layer when forming a patterned microelectronics layer from a blanket microelectronics layer formed interposed between a substrate and the conformal surface layer decomposed patterned photoresist layer.

The method of the present invention may be employed where the microelectronics fabrication is an integrated circuit microelectronics fabrication. The method of the present invention does not discriminate with respect to the nature of a microelectronics fabrication within which is formed a patterned microelectronics layer through the method of the present invention. Thus, the method of the present invention may be employed in forming patterned microelectronics layers within microelectronics fabrications including but not limited to integrated circuit microelectronics fabrications, solar cell microelectronics fabrications, ceramic substrate microelectronics fabrications and flat panel display microelectronics fabrications. Similarly, the method of the present invention does not discriminate with respect to the nature of a patterned microelectronics layer which may be formed through the method of the present invention. Thus, the method of the present invention may be employed in forming patterned microelectronics layers including but not limited to patterned microelectronics conductor layers, patterned microelectronics semiconductor layers and patterned microelectronics dielectric layers.

The method of the present invention is readily commercially implemented. The method of the present invention employs an isotropic irradiation of a patterned photoresist layer having a first linewidth to form a conformal surface layer decomposed patterned photoresist layer having a second linewidth narrower than the first linewidth. Since isotropic radiation means are generally known in the art of microelectronics fabrication, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

There is provided by the present invention a method for forming a patterned layer within a microelectronics fabrication, where the patterned layer is formed with narrow linewidth dimension without employing an advanced photoexposure apparatus. The method of the present invention realizes the foregoing objects by irradiating isotropically a patterned photoresist layer formed over a substrate within the microelectronics fabrication to form therefrom a conformal surface layer decomposed patterned photoresist layer which may be employed as an etch mask layer when forming a patterned microelectronics layer from a blanket microelectronics layer formed interposed between the substrate and the conformal surface layer decomposed patterned photoresist layer.

The method of the present invention may be employed in forming patterned layers within microelectronics fabrications including but not limited to integrated circuit microelectronics fabrications, solar cell microelectronics fabrications, ceramic substrate microelectronics fabrications and flat panel display microelectronics fabrications, where the patterned layers may be selected from the group of patterned layers including but not limited to patterned microelectronics conductor layers, patterned microelectronics semiconductor layers and patterned microelectronics dielectric layers.

First Preferred Embodiment

Figure 1:
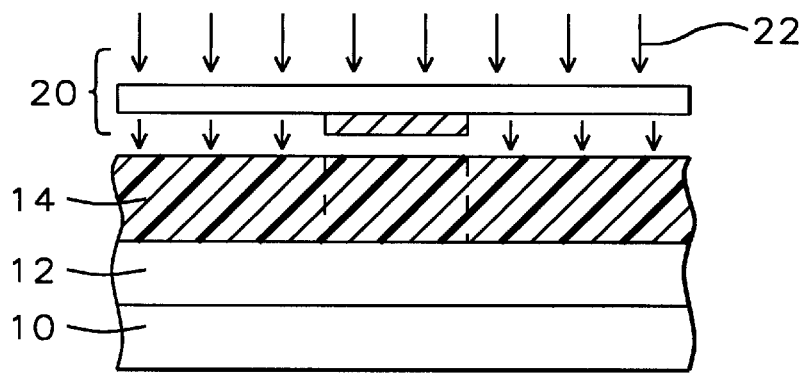
FIG. 1 to FIG. 4 show a series of schematic cross-sectional diagrams illustrating the results of progressive stages in forming within a microelectronics fabrication in accord with a general embodiment of the present invention which comprises a first preferred embodiment of the present invention a patterned microelectronics layer.

Referring now to FIG. 1 to FIG. 4, there is shown a series of schematic cross-sectional diagrams illustrating the results of forming within a microelectronics fabrication in accord with a general embodiment of the present invention which comprises a first preferred embodiment of the present invention a patterned microelectronics layer. Shown in FIG. 1 is a schematic cross-sectional diagram of the microelectronics fabrication at an early stage in practice of the method of the present invention.

Shown in FIG. 1 is a substrate 10 employed within a microelectronics fabrication, where the substrate has formed thereupon a blanket microelectronics layer 12 which in turn has formed thereupon a blanket photoresist layer 14.

Within the first preferred embodiment of the present invention, the substrate 10 may be a substrate employed within a microelectronics fabrication selected from the group of microelectronics fabrications including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be a substrate itself employed within the microelectronics fabrication, or in the alternative, the substrate 10 may be the substrate employed within the microelectronics fabrication, where the substrate has formed thereupon and/or thereover any of several additional layers as are typically employed within the microelectronics fabrication. Such additional layers may include, but are not limited to, microelectronics conductor layers, microelectronics semiconductor layers and microelectronics dielectric layers.

Similarly, although also not specifically illustrated within the schematic cross-sectional diagram of FIG. 1, the substrate may also have formed therein and/or thereupon any of several microelectronics devices as are conventional and appropriate to the microelectronics fabrication, where such microelectronics devices may include, but are not limited to, resistors, transistors, diodes and capacitors.

With respect to the blanket microelectronics layer 12, the blanket microelectronics layer 12 may be formed from any of several microelectronics materials as are conventional in the art of microelectronics fabrication, such microelectronics materials including but not limited to microelectronics conductor materials, microelectronics semiconductor materials and microelectronics dielectric materials. Typically and preferably, the blanket microelectronics layer 12 is formed to a thickness of from about 1000 to about 4000 angstroms.

With respect to the blanket photoresist layer 14, the blanket photoresist layer 14 is formed from a photoresist material which is susceptible to radiation induced conformal surface layer decomposition and attendant shrinkage. Within the first preferred embodiment of the present invention, the type of radiation employed within the radiation induced conformal surface layer decomposition and shrinkage may be the same type of radiation employed when photoexposing the blanket photoresist layer 14 to form a patterned photoresist layer. In the alternative, the type of radiation employed within the conformal surface layer decomposition and shrinkage may be a significantly different type of radiation than the type of radiation employed when photoexposing the blanket photoresist layer 14 to form a patterned photoresist layer. In the former circumstance, the blanket photoresist layer 14 as employed within the first preferred embodiment of the present invention is of necessity formed of a positive photoresist material. Similarly, in the later circumstance, the blanket photoresist layer 14 as employed within the first preferred embodiment of the present invention is not strictly limited to being formed from a positive photoresist material, and in the alternative may be formed from a negative photoresist material.

Within the first preferred embodiment of the present invention, the types of radiation employed within radiation induced conformal surface layer decomposition of the photoresist material from which is formed the blanket photoresist layer 14 include but are not limited to deep ultraviolet (DUV) (ie: 248 nanometer) radiation, near ultraviolet (NUV) (ie: 365 nanometer) radiation, multiple wavelength flood ultraviolet (UV) radiation, electron radiation and ion radiation.

Within the first preferred embodiment of the present invention, photoresist materials which provide photoresist layers which are susceptible to conformal surface layer decomposition are selected in conjunction with the type of radiation employed in providing the conformal surface layer decomposition of the photoresist layer. Such photoresist materials may include, but are not limited to, chemically amplified photoresist materials as are disclosed within the references within the Description of the Related Art, the teachings of which are incorporated herein fully by reference. Preferably, the blanket photoresist layer 14 is formed to a thickness of from about 4000 to about 10000 angstroms.

Finally, there is shown within FIG. 1 a photolithographic mask 20 disposed above the blanket photoresist layer 14, where the photolithographic mask 20 allows for selective irradiation of the blanket photoresist layer 14 while employing a substantially collimated photoexposure radiation beam 22. Within the first preferred embodiment of the present invention, the substantially collimated photoexposure radiation beam 22 preferably employs a deep ultraviolet (DUV) (ie: 248 nanometer) photoexposure radiation source.

Figure 2:
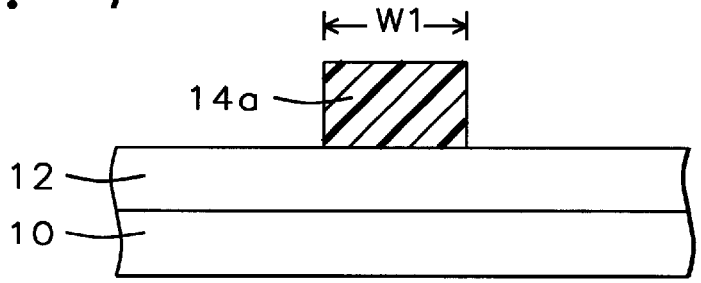

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket photoresist layer 14 as photoexposed as illustrated within FIG. 1 has been developed to form a patterned photoresist layer 14a as illustrated in FIG. 2. The blanket photoresist layer 14 as photoexposed as illustrated in FIG. 1 is preferably developed to form the patterned photoresist layer 14a as illustrated in FIG. 2 through methods as are conventional in the art of microelectronics fabrication. As is illustrated within the schematic cross-sectional diagram of FIG. 2, the patterned photoresist layer 14a has a linewidth W1 upon the blanket microelectronics layer 12, where the linewidth W1 is typically no less than about 0.22 microns when employing deep ultraviolet (DUV) (ie: 248 nanometer) exposure radiation within the substantially collimated photoexposure radiation beam 22, although under certain circumstances with exceedingly thin photoresist layers on the order of about 4000 to about 5000 angstroms thickness it is possible to obtain a linewidth W1 of the patterned photoresist layer 14a as narrow as about 0.18 microns.

Figure 3:
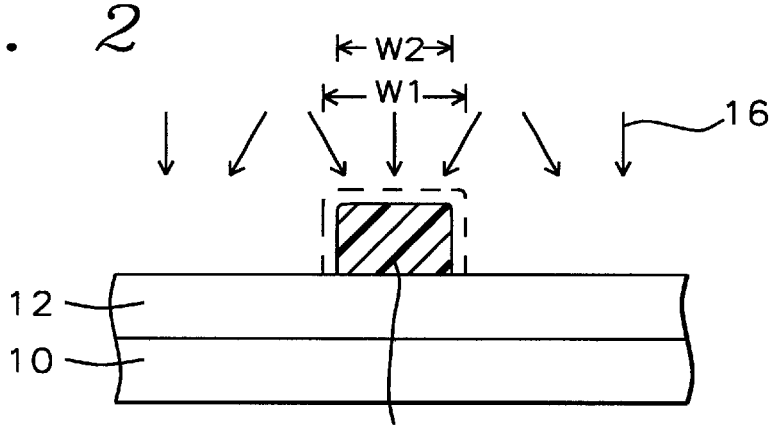

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the patterned photoresist layer 14a has been treated within an isotropic radiation treatment 16 to form a conformal surface layer decomposed patterned photoresist layer 14a'. As is illustrated within the schematic cross-sectional diagram of FIG. 3, the conformal surface layer decomposed patterned photoresist layer 14a' has a linewidth W2 upon the blanket microelectronics layer 12 which is substantially equal to the linewidth W1 of the patterned photoresist layer 14a minus two times the thickness of a conformal surface layer which is decomposed from the top surface and the sidewall surfaces of the patterned photoresist layer 14a.

Within the first preferred embodiment of the present invention, the linewidth W2 of the conformal surface layer decomposed patterned photoresist layer 14a' is preferably from about 0.15 to about 0.20 microns corresponding with decomposition of a conformal surface layer of thickness about 0.01 to about 0.03 microns from each of the top and sidewall surfaces of the patterned photoresist layer 14a.

Figure 4:
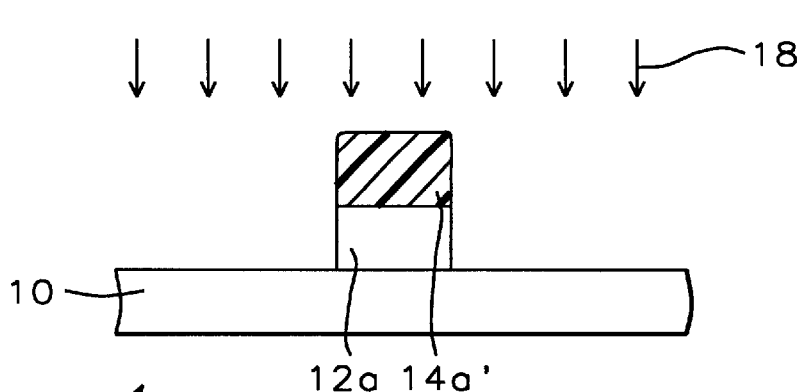

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein the blanket microelectronics layer 12 has been patterned to form the patterned microelectronics layer 12a through use of a microelectronics layer etching plasma 18 while employing the conformal surface layer decomposed patterned photoresist layer 14a' as an etch mask layer. Within the first preferred embodiment of the present invention, the microelectronics layer etching plasma 18 preferably employs an etchant gas composition appropriate to the material from which is formed the blanket microelectronics layer 12.

Upon forming the microelectronics fabrication whose schematic cross-sectional diagram is illustrated in FIG. 4, there may be formed a microelectronics fabrication having formed therein a patterned microelectronics layer of linewidth at least as narrow as about 0.15 angstroms while employing a deep ultraviolet (DUV) (ie: 248 nanometer) photoexposure radiation method. Thus, there may be formed in accord with the first preferred embodiment of the present invention within a microelectronics fabrication a patterned microelectronics layer of attenuated narrow linewidth without employing an advanced photoexposure apparatus.

Second Preferred Embodiment

Figure 5:
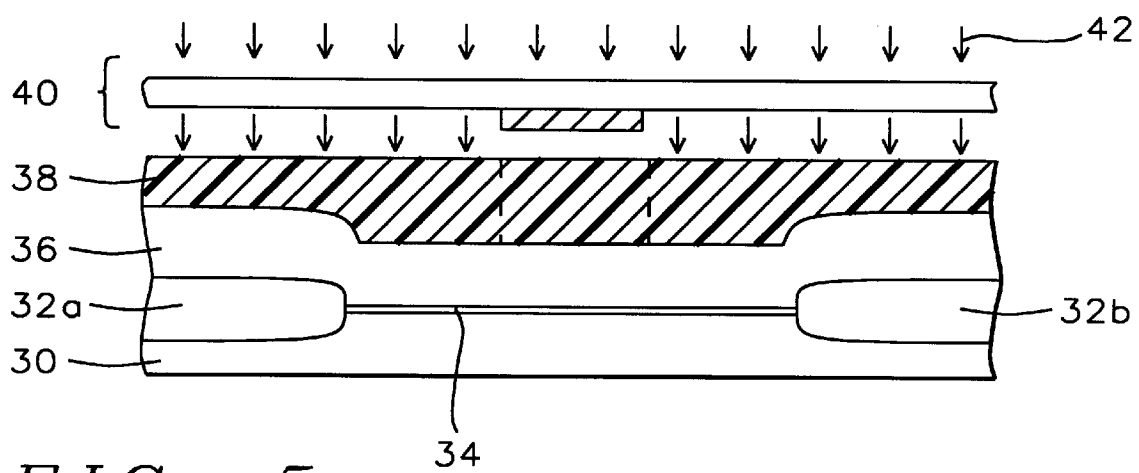
FIG. 5 to FIG. 9 show a series of schematic cross-sectional diagrams illustrating the results of forming within an integrated circuit microelectronics fabrication in accord with a more specific embodiment of the present invention which comprises a second preferred embodiment of the present invention a gate electrode within a field effect transistor (FET).

Referring now to FIG. 5 to FIG. 9, there is shown a series of schematic cross-sectional diagrams illustrating the results of forming within an integrated circuit microelectronics fabrication in accord with a more specific embodiment of the present invention which comprises a second preferred embodiment of the present invention a gate electrode of linewidth dimension at least as narrow as about 0.15 micron while employing deep ultraviolet (DUV) (ie: 248 nanometer) photoexposure radiation. Shown in FIG. 5 is a schematic cross-sectional diagram of the integrated circuit microelectronics fabrication at an early stage in its fabrication in accord with the second preferred embodiment of the present invention.

Shown in FIG. 5 is a semiconductor substrate 30 having formed within and upon its surface a pair of isolation regions 32a and 32b which define an active region of the semiconductor substrate 30. Although semiconductor substrates are known in the art with either dopant polarity, several dopant concentrations and various crystallographic orientations, for the second preferred embodiment of the present invention the semiconductor substrate 30 is preferably a (100) silicon semiconductor substrate having an N- or P- doping. Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the second preferred embodiment of the present invention, the isolation regions 32a and 32b are preferably formed within and upon the semiconductor substrate 30 to define the active region of the semiconductor substrate 30 employing an isolation region thermal growth method at a temperature of from about 800 to about 1100 degrees centigrade to form the isolation regions 32a and 32b of silicon oxide within and upon the semiconductor substrate 30.

There is also shown in FIG. 5 formed upon the active region of the semiconductor substrate 30 defined by the isolation regions 32a and 32b a blanket gate dielectric layer 34. Although it is also known in the art of integrated circuit microelectronics fabrication that blanket gate dielectric layers may be formed employing methods including but not limited to blanket gate dielectric layer thermal growth methods and blanket gate dielectric layer deposition methods, for the second preferred embodiment of the present invention the blanket gate dielectric layer 34 is preferably formed employing a blanket gate dielectric layer thermal growth method at a temperature of from about 800 to about 1100 degrees centigrade to form the blanket gate dielectric layer 34 of silicon oxide of thickness about 20 to about 100 angstroms formed upon the active region of the semiconductor substrate 30.

There is also shown in FIG. 5 formed over the semiconductor substrate 30 and upon the isolation regions 32a and 32b and the blanket gate dielectric layer 34 a blanket gate electrode material layer 36, and there is shown formed upon the blanket gate electrode material layer a blanket photoresist layer 38.

Within the second preferred embodiment of the present invention, the blanket gate electrode material layer 36 is preferably formed of a gate electrode material otherwise conventional in the art of integrated circuit microelectronics fabrication. Such gate electrode materials include, but are not limited to, doped polysilicon gate electrode materials and polycide (doped polysilicon/metal silicide stack) gate electrode materials. Preferably the blanket gate electrode material layer 36 is formed to a thickness of from about 1000 to about 4000 angstroms.

Within the second preferred embodiment of the present invention with respect to the blanket photoresist layer 38, the blanket photoresist layer 38 is preferably formed employing methods, materials and dimensions analogous or equivalent to the methods, materials and dimensions employed in forming the blanket photoresist layer 14 within the first preferred embodiment of the present invention as illustrated within the schematic cross-sectional diagram of FIG. 1. More preferably, within the second preferred embodiment of the present invention, the blanket photoresist layer 38 is formed of a positive chemically amplified photoresist material which employs a photogenerated acid to enhance decomposition of photoirradiated portions of the blanket photoresist layer 38.

Finally, there is also shown within FIG. 5 disposed above the microelectronics fabrication a photolithographic mask 40 through which passes a substantially collimated photoexposure radiation beam 42. Within the second preferred embodiment of the present invention, the photolithographic mask 40 and the substantially collimated photoexposure radiation beam 42 are generally equivalent to the photolithographic mask 20 and the substantially collimated photoexposure radiation beam 22 as employed within the first preferred embodiment of the present invention as illustrated within the schematic cross-sectional diagram of FIG. 1.

Figure 6:
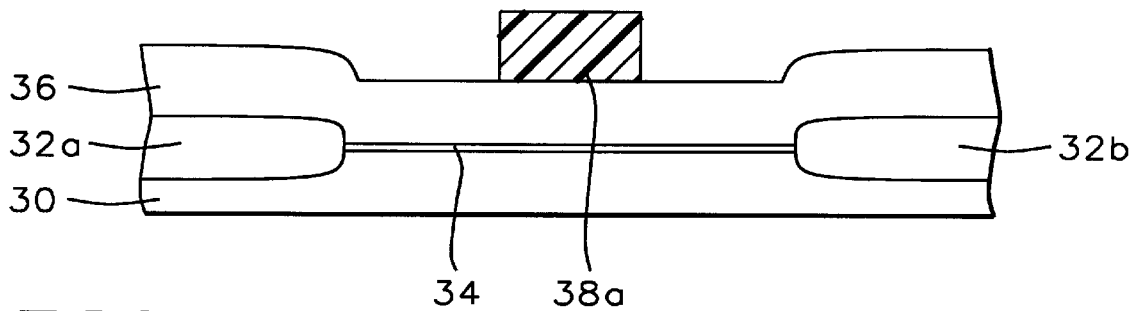

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein the blanket photoresist layer 38 has been developed to form a patterned photoresist layer 38a. Within the second preferred embodiment of the present invention, the patterned photoresist layer 38a is preferably developed from the blanket photoresist layer 38 employing methods, materials and dimensions analogous or equivalent to the methods, materials and dimensions through which the patterned photoresist layer 14a is developed from the blanket photoresist layer 14 as illustrated within the first preferred embodiment of the present invention within the schematic cross-sectional diagrams of FIG. 1 and FIG. 2.

Figure 7:
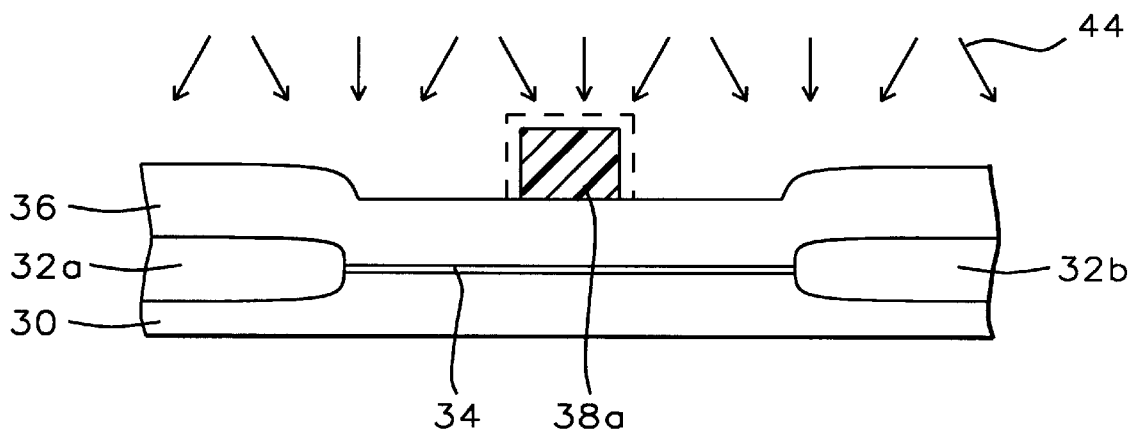

Referring now to FIG. 7, there is shown a schematic cross-sectional diagram illustrating the results of further processing of the integrated circuit microelectronics fabrication whose schematic cross-sectional diagram is illustrated in FIG. 6. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 6, but wherein the patterned photoresist layer 38a as illustrated within the schematic cross-sectional diagram of FIG. 6 has been irradiated isotropically with an isotropic radiation treatment 44 to decompose a conformal surface layer of the patterned photoresist layer 38a while simultaneously forming a conformal surface layer decomposed patterned photoresist layer 38a'. Within the second preferred embodiment of the present invention, the conformal surface layer decomposed patterned photoresist layer 38a' is preferably formed from the patterned photoresist layer 38a employing methods and materials analogous or equivalent to the methods and materials through which the conformal surface layer decomposed patterned photoresist layer 14a' as illustrated within the schematic cross-sectional diagram of FIG. 3 is formed from the patterned photoresist layer 14a whose schematic cross-sectional diagram is illustrated in FIG. 2.

More preferably, within the second preferred embodiment of the present invention, the isotropic radiation treatment 44 is an isotropic ultraviolet radiation treatment employing a flood exposure apparatus as is conventional in the art of microelectronics fabrication. The ultraviolet radiation within the isotropic ultraviolet radiation treatment so provided typically incorporates several ultraviolet wavelengths. Particularly important within the second preferred embodiment of the present invention when employing a positive chemically amplified photoresist material which employs a photochemical generated acid for forming the patterned photoresist layer 38a is the control of substrate temperature within the isotropic ultraviolet radiation treatment. Preferably the substrate temperature is controlled within a range of from about 100 to about 200 degrees centigrade to provide optimal conformal surface layer degradation when forming the conformal surface layer decomposed patterned photoresist layer 38a' from the patterned photoresist layer 38. The substrate temperature so controlled may be adjusted from a first temperature to a second temperature within the preferred range of from about 100 to about 200 degrees centigrade, in conjunction with timing of the ultraviolet radiation treatment, when forming the conformal surface layer decomposed patterned photoresist layer 38a' from the patterned photoresist layer 38. Preferably, the isotropic radiation treatment also employs: (1) a reactor chamber pressure of about 10 to about 800 torr; (2) a mercury ultraviolet light source; (3) a radiation energy of from about 0.1 to about 5 watts/nanometer totally isotropically reflected to an eight inch substrate diameter; (4) a nitrogen or air purge gas flow; and (5) an exposure time of from about 10 to about 100 seconds.

Figure 8:
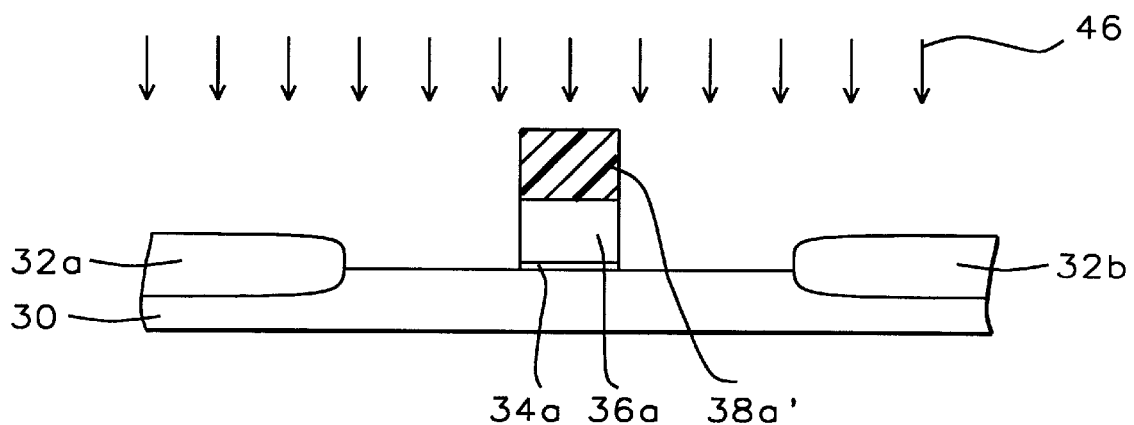

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein the blanket gate electrode material layer 36 and the blanket gate dielectric layer 34 have been patterned to form a corresponding gate electrode 36a and a corresponding gate dielectric layer 34a through use of an anisotropic etching plasma 46 while employing the conformal surface layer decomposed patterned photoresist layer 38a' as an etch mask layer. Within the second preferred embodiment of the present invention, where the blanket gate electrode material layer 36 is preferably formed of a polysilicon or a polycide gate electrode material and the blanket gate dielectric layer 34 is preferably formed of a silicon oxide dielectric material, the anisotropic etching plasma 46 preferably employs a chlorine containing etchant gas composition followed by a fluorine containing etchant gas composition.

Figure 9:
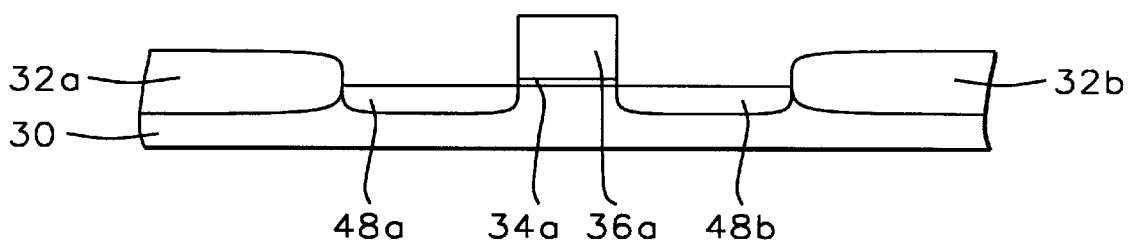

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein: (1) there has been stripped from the integrated circuit microelectronics fabrication the conformal surface layer decomposed patterned photoresist layer 38$a'$; and (2) there has been formed within the active region of the semiconductor substrate 30 at areas other than those covered by the gate electrode 36$a$ and the gate dielectric layer 34$a$ a pair of source/drain regions 48$a$ and 48$b$.

Within the second preferred embodiment of the present invention, the conformal surface layer decomposed patterned photoresist layer 38$a'$ is preferably stripped from the integrated circuit microelectronics fabrication whose schematic cross-sectional diagram is illustrated in FIG. 8 to form in part the integrated circuit microelectronics fabrication whose schematic cross-sectional diagram is illustrated in FIG. 9 through methods as are conventional in the art of integrated circuit microelectronics fabrication. Such methods may include, but are not limited to, dry plasma stripping methods and wet chemical stripping methods. Similarly, the source/drain regions 48$a$ and 48$b$ as illustrated within the integrated circuit microelectronics fabrication whose schematic cross-sectional diagram is illustrated within FIG. 9 may be formed employing methods which are similarly conventional in the art of integrated circuit microelectronics fabrication. Such methods will typically include ion implant methods at an ion implantation dosage of from about 1E13 to about 1E16 ions per square centimeter and ion implantation energy of from about 10 to about 100 keV.

Upon forming the integrated circuit microelectronics fabrication whose schematic cross-sectional diagram is illustrated in FIG. 9, there is formed an integrated circuit microelectronics fabrication having formed therein a field effect transistor (FET) having a gate electrode which may be formed of linewidth at least as narrow as about 0.15 microns while employing deep ultraviolet (DUV) (ie: 248 nanometer) photoexposure radiation. Thus, there is formed employing the second preferred embodiment of the present invention an integrated circuit microelectronics fabrication having formed therein an integrated circuit device with an attenuated narrow linewidth without employing an advanced photoexposure apparatus.

EXAMPLES

Upon each semiconductor substrate within a pair of eight inch semiconductor substrates was formed an anti-reflective coating layer of thickness about 550 angstroms from a DUV-18 anti-reflective coating material available from Brewer Science, Inc., Rolla, Mo. Upon each of the two anti-reflective coating layers was then formed a photoresist layer of thickness about 7700 angstroms from a SEPR-4202 PB positive photochemical acid generator chemically amplified photoresist material available from Shin-Etsu Co., Japan.

Each of the two photoresist layers was then photoexposed and developed to form a series of patterned photoresist lines of nominal linewidth about 0.25 microns separated by a pitch of about 0.25 microns. The patterned photoresist lines upon one of the semiconductor substrates was then irradiated isotropically employing an isotropic ultraviolet irradiation apparatus commercially available from Fusion Corporation. The apparatus employed a mercury bulb radiation source having a radiant power output of about 2.5 watts/nanometer separated from the surface of the substrate by a distance of about 10 centimeters. The isotropic ultraviolet irradiation method also employed a substrate temperature of about 75 degrees centigrade for a time period of about 100 seconds under an inert nitrogen or air gas purge.

The patterned photoresist lines upon the second semiconductor substrate were irradiated isotropically under conditions otherwise equivalent to the conditions employed when isotropically irradiating the patterned photoresist lines upon the first semiconductor substrate, but at a temperature of about 170 degrees centigrade.

Measurements of patterned photoresist line linewidths after development of the patterned photoresist lines (ADI) and after isotropic ultraviolet irradiation of the patterned photoresist lines (AUI) were obtained and are reported in Table I.

TABLE I

| Example | Substrate Temp. | ADI L/width (um) | AUI L/width (um) | Etch Bias (um) |
|---|---|---|---|---|
| 1 | 75 C. | 0.246 +/− 0.013 | 0.230 +/− 0.025 | −0.016 +/− 0.016 |
| 2 | 170 C. | 0.239 +/− 0.007 | 0.188 +/− 0.032 | −0.051 +/− 0.030 |

As is seen from review of the data in Table I, there is observed a significant negative etch bias for the patterned photoresist layers formed irradiated at the elevated substrate temperature of about 170 degrees centigrade. It is believed that the elevated substrate temperature assists significantly in the chemical amplification process which photochemically generates acid within the photoresist material employed within the examples.

What is claimed is:

1. A method for forming a patterned photoresist layer comprising:

providing a substrate;

forming over the substrate a blanket photoresist layer formed from a positive chemically amplified photoresist material;

photoexposing and developing the blanket photoresist layer to form a patterned photoresist layer having a first linewidth; and irradiating isotropically the patterned photoresist layer with an isotropic radiation source to partially decompose the patterned photoresist layer and thus form a partially decomposed patterned photoresist layer having a second linewidth narrower than the first linewidth, wherein the patterned photoresist layer is isotropically irradiated while the substrate is at a temperature of 100 to 200 degrees centigrade.

2. The method of claim 1 wherein the substrate is employed in a microelectronics fabrication selected from the group consisting of an integrated circuit microelectronics fabrication, a solar cell microelectronics fabrication, a ceramic substrate microelectronics fabrication and a flat panel display microelectronics fabrication.

3. The method of claim 1 wherein the isotropic radiation source is selected from the group consisting of deep ultraviolet radiation sources, near ultraviolet radiation sources, multiple wavelength flood ultraviolet radiation sources, electron radiation sources and ion radiation sources.

4. The method of claim 1 further comprising:

forming a blanket microelectronics layer over the substrate prior to forming the blanket photoresist layer over the substrate, the blanket photoresist layer being formed upon the blanket microelectronics layer; and etching, while employing an anisotropic plasma etch method, the blanket microelectronics layer to form a patterned microelectronics layer while employing the partially decomposed patterned photoresist layer as an etch mask layer.

5. The method of claim 4 wherein the microelectronics layer is selected from the group consisting of microelectronics conductor layers, microelectronics semiconductor layers and microelectronics dielectric layers.

6. A method for forming a gate electrode comprising:

providing a semiconductor substrate;

forming upon the semiconductor substrate a gate dielectric layer;

forming upon the gate dielectric layer a blanket gate electrode material layer;

forming upon the blanket gate electrode material layer a blanket photoresist layer formed from a positive chemically amplified photoresist material;

photoexposing and developing the blanket photoresist layer to form a patterned photoresist layer having a first linewidth;

irradiating isotropically the patterned photoresist layer with an isotropic radiation source to partially decompose the patterned photoresist layer and thus form a partially decomposed patterned photoresist layer having a second linewidth narrower than the first linewidth, wherein the patterned photoresist layer is isotropically irradiated while the semiconductor substrate is at a temperature of 100 to 200 degrees centigrade; and etching anisotropically the blanket gate electrode material layer to form a gate electrode while employing the partially decomposed patterned photoresist layer as an etch mask layer.

7. The method of claim 6 wherein the isotropic radiation source is selected from the group consisting of deep ultraviolet radiation sources, near ultraviolet radiation sources, multiple wavelength flood ultraviolet radiation sources, electron radiation sources and ion radiation sources.

* * * * *